(12) United States Patent
Aleksanyan et al.

(10) Patent No.: US 7,768,840 B1
(45) Date of Patent: Aug. 3, 2010

(54) MEMORY MODELING USING AN INTERMEDIATE LEVEL STRUCTURAL DESCRIPTION

(75) Inventors: Karen Aleksanyan, Yerevan (AM); Karen Amirkhanyan, Yerevan (AM); Samvel Shoukourian, Yerevan (AM); Valery Vardanian, Yerevan (AM); Yervant Zorian, Santa Clara, CA (US)

(73) Assignee: Virage Logic Corporation, Fremont, CA (US)

( * ) Notice: Subject to any disclaimer, the term of this patent is extended or adjusted under 35 U.S.C. 154(b) by 509 days.

(21) Appl. No.: 11/847,047

(22) Filed: Aug. 29, 2007

(51) Int. Cl.
*G11C 7/00* (2006.01)
(52) U.S. Cl. .............. 365/189.02; 365/201; 365/230.02
(58) Field of Classification Search ............ 365/189.02, 365/201, 230.02
See application file for complete search history.

(56) References Cited

U.S. PATENT DOCUMENTS

| | | | |
|---|---|---|---|
| 6,738,953 B1 | 5/2004 | Sabharwal et al. | |
| 2006/0273809 A1* | 12/2006 | Miller et al. | 324/754 |
| 2007/0179772 A1* | 8/2007 | Beausoleil et al. | 703/24 |

OTHER PUBLICATIONS

Ad. J. van de Goor, et al., "Address and Data Scrambling: Causes and Impact on Memory Tests", IEEE Computer Society 2002, Proceedings of the First IEEE International Workshop on Electronic Design, Test and Applications (Delta'02), (9 pages).
Lynn Youngs, et al., "Mapping and Repairing Embedded-Memory Defects", Memory Defect Mapping, 1997 IEEE, IEEE Design & Test Computers, (pp. 18-24).
Verplex, Product Overview, Copyright 1998-2003 Verplex Systems, Inc., www.verplex.com, 3 pages.
"Encounter Conformal Equivalence Checker", Datasheet, Cadence, Copyright 2006 Cadence Design Systems, Inc., www.cadence.com, pp. 1-4.
"Encounter Conformal Equivalence Checker", Datasheet, Cadence, Copyright 2007 Cadence Design Systems, Inc., www.cadence.com, pp. 1-4.

* cited by examiner

*Primary Examiner*—Son Dinh
(74) *Attorney, Agent, or Firm*—Rutan & Tucker LLP

(57) ABSTRACT

A computer-implemented method for creating an integrated circuit, IC, test engine for testing a proposed IC memory array using new memory structural model. An IC designer inputs the number of words that can be stored and a column multiplexer ratio in a proposed IC memory array. A selection of one or more procedures is made from a library of computer-readable procedures. Each of the procedures is to produce one or more structural primitives that describe certain physical layout features of the proposed IC memory array, without analyzing a CAD layout file of the proposed IC memory array. The library of procedures as a whole translates between a physical model of a family of IC memory arrays and a user interface model of the family. A data background, DB, pattern is produced to be used by the test engine in testing the proposed IC memory array. This is done by executing the selected one or more procedures, wherein these procedures take as input the received number of words and column multiplexer size. Other embodiments are also described.

19 Claims, 7 Drawing Sheets

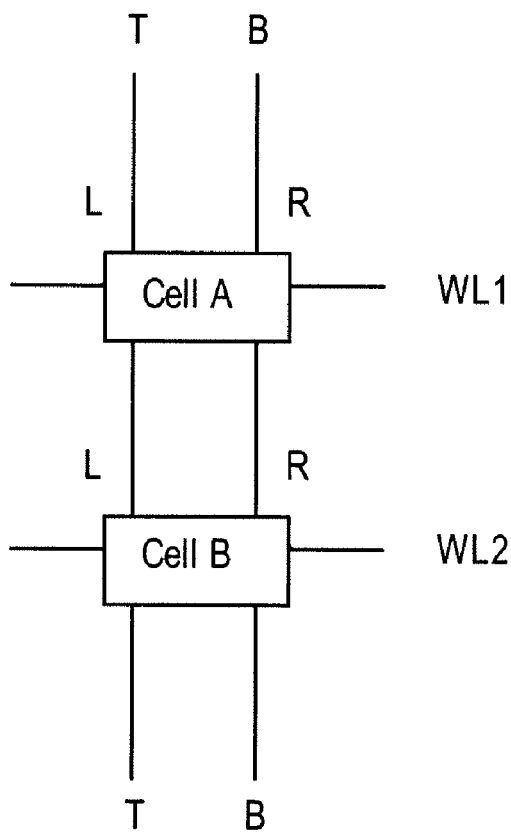 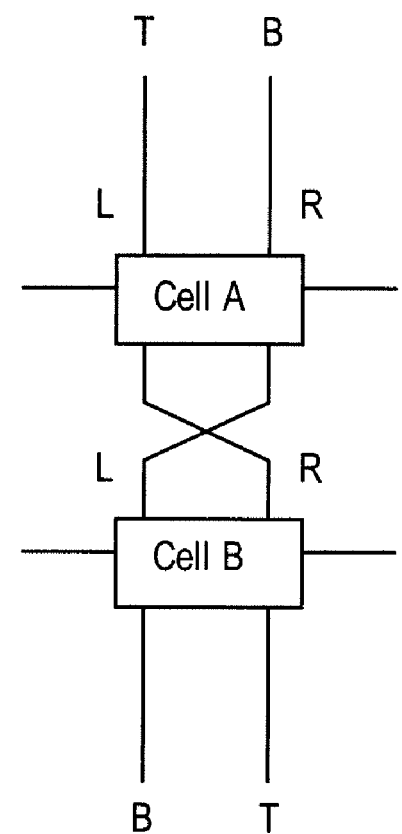
FIG. 2A  FIG. 2B

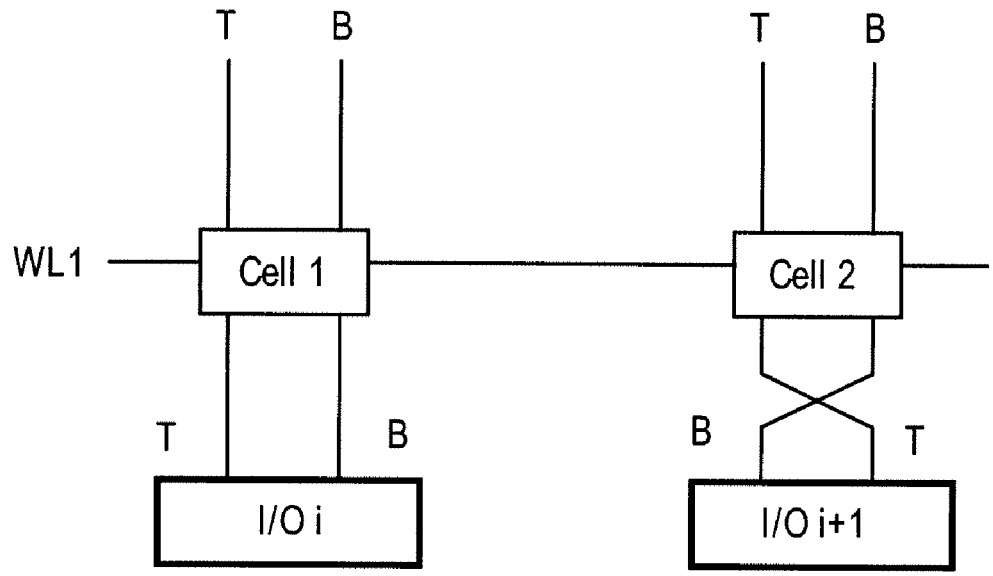
FIG. 3A     FIG. 3B
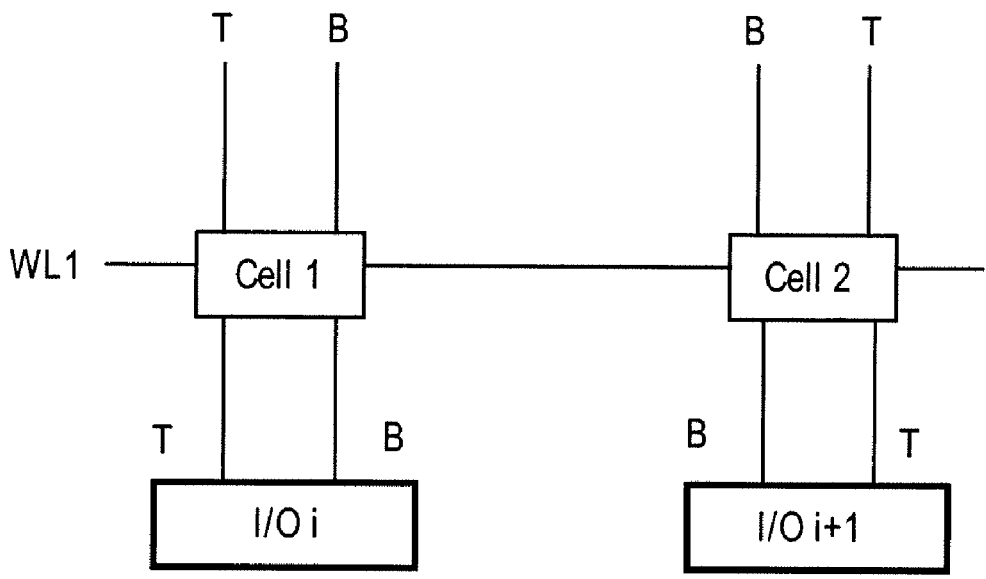
FIG. 4

MEMORY MODELING USING AN INTERMEDIATE LEVEL STRUCTURAL DESCRIPTION

BACKGROUND

An embodiment of the invention generally pertains to large scale integration memory integrated circuits (ICs) that may be used for data storage in a computer, and more particularly to the modeling and computer aided design and testing of such ICs.

Advanced semiconductor IC manufacturing techniques are currently driving the development of re-usable IC designs. Computer aided design (CAD) tools such as memory compilers have been developed that allow an IC designer to more efficiently design and verify the operation of a memory component, prior to starting the complex and costly volume manufacturing process for it. A memory component design or intellectual property (IP) component is generated using the compiler that meets a stated performance specification system. This memory IP component may be re-used, to become part of different manufactured IC packages. These include dedicated memory IC packages and a system on a chip (SoC) with embedded memory.

Memory is typically implemented as an array of storage cells, where each cell stores a discrete bit of information (e.g. a binary storage cell can store either a "0" or a "1"). Column and row decoding logic in the memory maps an externally provided address into a selection of one or more of the cells. Once selected, the cells can be either written into or read from, depending on the external command. To test memory, a test engine generates a predefined data pattern which is written to a given address range, and then some time later the given address range is read back. The test engine compares the results of the read with the predefined data pattern, to see if there is any difference that would indicate an error in the memory's operation.

An effective way to test a large scale memory IC is to fill the memory with a particular type of data background (DB). The following are some example DB patterns: solid (all memory cells are filled with "0", or its inverse in which all memory cells are filled with "1"); checkerboard (alternating pattern of "0"s and "1"s in both the row and column directions, or its inverse); and row stripe (rows filled with "0"s alternate with rows filled with "1"s, or its inverse). The proper DB to use depends on the type of fault or defect to be detected.

As explained above, a DB pattern stored in an array of memory cells is generic in that the basic, internal appearance of the pattern would be the same for different types or different sizes of memories. However, the address sequences and data patterns needed on the outside of a memory, to obtain a particular DB pattern, may be different for other types or sizes of memories. That is because the physical or topological internal structure of memory in an IC chip differs from its logical structure that is seen by the user from outside the chip. This effect is referred to as scrambling. For example, logically adjacent addresses may not be physically adjacent (this is called address scrambling), and logically adjacent data bits may not be physically adjacent (this is called data scrambling).

Memory testing also calls for the test engine to determine the physical location of a fault, so that a repair can be affected. For instance, when a faulty cell has been located as being in a particular column, that column can be replaced by a redundant column in the memory (by rerouting address and data signals of the faulty column to the redundant one.) This is also referred to as memory diagnosis and repair. Memory diagnosis may also call for generating a bitmap view of the defective cells in the memory. To do so, the designer of a system IC typically manually extracts information about the physical topology of a memory design from its CAD layout file (that has been produced by a memory compiler), as needed to solve particular test problems. For example, to find the logical address and data sequences needed to write a given DB pattern (the "logical model"), the system IC designer reviews the CAD layout file to determine several physical aspects of the memory design that will impact the logical model. This involves reviewing the layout file to determine data scrambling and bit-line twisting, for example, and then using that information to determine the particular logical address and data sequences needed. The system IC designer then authors a piece of computer code into which these results are incorporated, where this piece of code implements the functionality of generating the DB pattern (the logical model) within the memory's test engine. The test engine so designed becomes a part of the memory (once manufactured) and is able to quickly generate the DB pattern for testing.

SUMMARY

In accordance with an embodiment of the invention, a computer-implemented method creates an integrated circuit, IC, test engine for testing a proposed IC memory array, using new memory structural model. An IC designer inputs the number of words that can be stored and a column multiplexer ratio in a proposed IC memory array. A selection of one or more procedures is made from a library of computer-readable procedures. Each of the procedures is to produce one or more structural primitives that describe certain physical layout features of the proposed IC memory array, without analyzing a CAD layout file of the proposed IC memory array. The library of procedures as a whole translates between a physical model of a family of IC memory arrays and a user interface model of the family. As an example, a data background, DB, pattern is produced by the method, to be used by the test engine in testing the proposed IC memory array. This is done by executing the selected one or more procedures, where these procedures take as input the received number of words and column multiplexer size. Other embodiments are also described.

BRIEF DESCRIPTION OF THE DRAWINGS

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the design.

FIG. 2a illustrates a pair of adjacent memory cells of the same column whose associated bitline shows no twist.

FIG. 2b shows two adjacent cells in the same column, where the bitlines connecting the two cells to each other have a twist.

FIG. 3a shows a memory cell whose direct bitline connection to the corresponding I/O cell of its column has no I/O bitline twist.

FIG. 3b shows another cell that is on the same word line as the one in FIG. 2a, but that has an I/O bitline twist above its associated I/O cell.

FIG. 4 shows an instance of I/O bitline mirroring between cells in adjacent columns.

DETAILED DESCRIPTION

Figure 1:
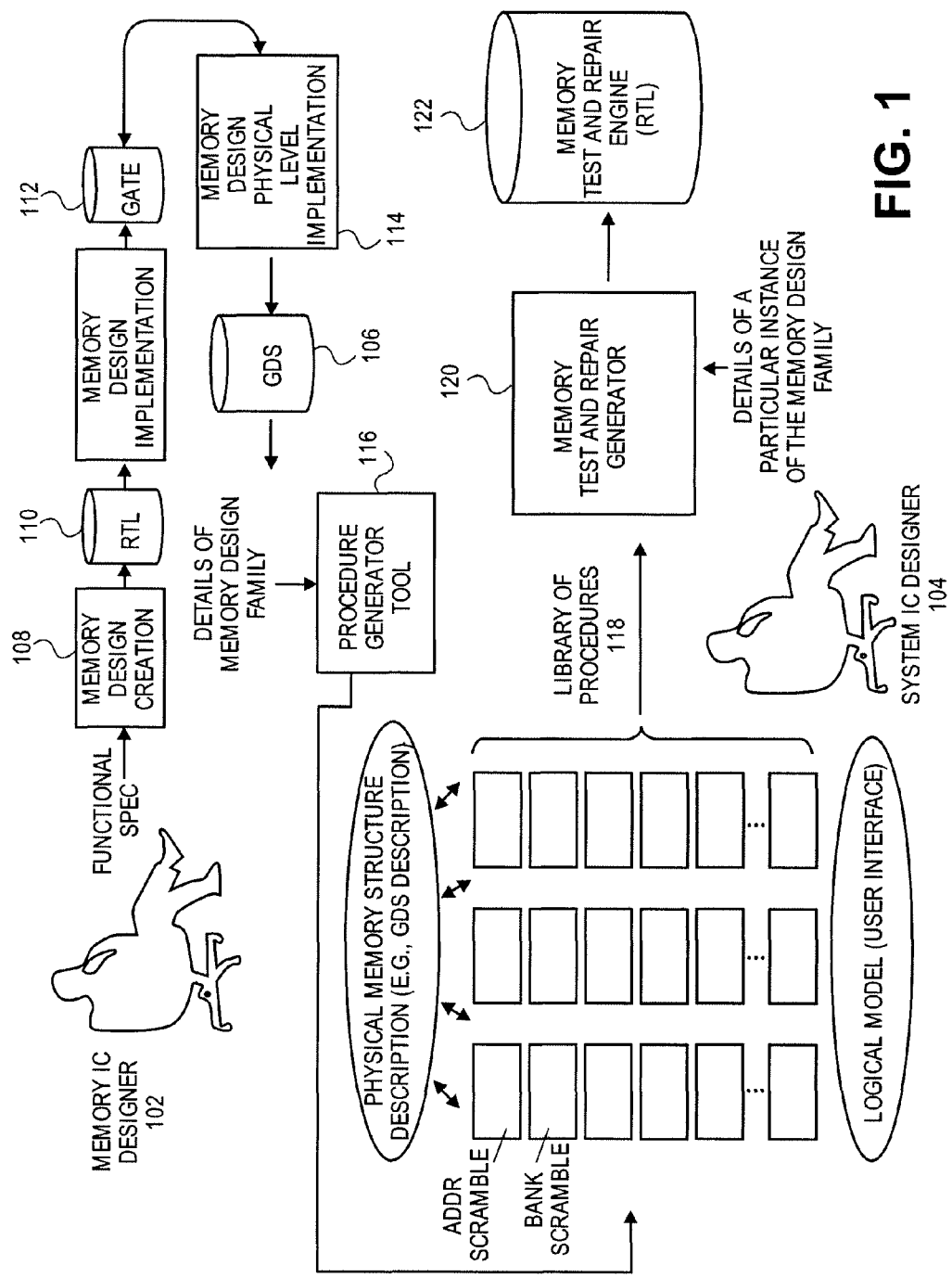
FIG. 1 is a block diagram of the overall process for creating a design tool and its subsequent use by a system IC designer to create a test engine for an IC memory design, in accordance with an embodiment of the invention.

An efficient methodology is needed for producing a memory test engine that can automatically and efficiently generate the data sequences needed for applying different DB patterns to a given memory design, locate faults for repair, and/or generate a bitmap view of defective cells. In accordance with an embodiment, a systematic approach (language) is provided here that defines new memory structural model via set of structural primitives. These can be viewed as basic building blocks within an intermediate level description of a given memory design, between its physical layout (also referred to as the physical model) and the logical or user interface level.

There is also a demand for memory compilers that provide programmable DB patterns for memory test algorithms. In addition to the traditional checkerboard pattern, other topological (physical) patterns include solid, row stripe, column stripe, double row stripe, double column stripe, as well as others. Generating a physical DB pattern for a proposed memory IC design uses a number of different types of scrambling information. This scrambling information identifies the differences between the topological or physical features of a memory structure, and the logical or user interface level.

In accordance with an embodiment, a library of procedures that provide scrambling information is created for a family of memory designs, using knowledge of the physical structure of the designs. An example is the STAR family of memories offered by Virage Logic Corp. of Fremont, Calif. The library together with CAD layout files that are specific to one or more memory designs (from the family) are provided to a system IC designer. The system IC designer is faced with the task of incorporating the memory design into a larger integrated circuit design, such as that of a system on a chip (SoC), and developing a built in test engine for it.

The system IC designer defines his test problem or test application, and selects from the library certain procedures. A few examples of the test applications are a DB pattern generator, coordinate calculator and bitmap viewer (to be further described below). The selected procedures specify only the necessary and sufficient structural primitives of the memory design, that are needed to achieve the functionality for solving the particular problem or test application. There is no need for the system IC designer to analyze the entirety of the typically very large and complex CAD layout file of the memory design in detail, to identify the relevant aspects of the physical model. The structural primitives needed for this particular memory modeling task are automatically provided by the selected procedures and may then be incorporated, by a program that may be authored by the system IC designer (or that may be authored by the memory IC designer), into the final design of the test engine. This approach to creating the test engine for a given test application reduces the number of structural primitives that are used to a minimum, thereby saving CAD workstation resources as well as time. This allows, for example, more rapid development of a SoC with embedded memory and built-in memory test engine.

FIG. 1 is a block diagram of the overall process for creating an IC design tool and its subsequent use by a system IC designer to create a test engine for an embedded memory IC design, in accordance with an embodiment. This diagram contemplates work by two different IC designers, namely a memory IC designer 102 and a system IC designer 104. As an alternative, however, the entire process may be performed by the same IC designer who may be working for a single entity that is responsible for developing both the memory design and the design of the system in which the memory will be incorporated.

The memory IC designer 102 is responsible for defining or taking a functional specification for IC memory, and translating these high level functional requirements into a physical level implementation, ultimately in the form of a computer-aided design (CAD) layout file. In FIG. 1, this physical layout file is represented using a graphic data system (GDS) file 106. The GDS format is a currently popular format for aiding interchange of IC mask information. It may generally be viewed as a completed IC design that is ready for delivery to, for instance, a mask vendor.

The process begins with the creation of a memory design based on the functional specification, using known CAD software running on a computer (operation 108). This results in a design or description of the IC, such as in a register transfer level (RTL) format. The RTL file 110 is an example of a hardware description language that describes a circuit's behavior in terms of the flow of signals or transferred data between hardware registers, as well as the logical operations that are performed on those signals.

Next, the CAD software (with the help of the memory IC designer 102) implements the memory design by converting the RTL description into a gate level description (gate level file 112). This is often done using a logic synthesis software tool. The results of the synthesis are then used by placement and routing tools to create the physical layout (here, GDS file 106), during what is referred to as the physical level implementation (operation 114). The overall process for producing the physical level description or physical layout of the IC memory may be repeated using memory compiler software, to produce a family of several different memory designs by the memory IC designer 102 (or the entity with whom he is associated).

Details of the memory design family that have been created may then be provided to a procedure generator tool 116. The tool 116 is for a computer-implemented method of creating a library of procedures 118. The tool 116 may be part of a memory compiler that has been created for a family of memory designs. Such a compiler may generate different instances of a memory array, which are encompassed by a given family of memory arrays. Each instance of a memory array may have a different number of words, a different word size, and/or a different layout (e.g. the same column decode architecture but different row decoding). All members of a family may have the same bit cell size, the same amount of total storage, the same approximate range of read or write latency performance, and are to be manufactured using the same integrated circuit manufacturing process technology (e.g. complementary metal oxide semiconductor, or CMOS). An example of a family of memory designs is the STAR memory family by Virage Logic.

The computer-readable procedures, when executed by a computer, produce a set of structural primitives that describe certain physical layout features of a proposed IC memory array, without analyzing a CAD layout file of the proposed IC memory array. As depicted in FIG. 1, the library of procedures 118 as a whole translate between a physical model of the family of IC memories, and a user interface or logical model of the family. The procedures describe the scrambling information that is relevant to applications which test an IC memory.

The procedures described below may use certain global parameters or variables. The values of these variables may be specified by the system IC designer 104 as part of the details of a particular instance of the memory design family (also referred to as a proposed memory IC design). Such global parameters include the number of words in the proposed memory array (NW), the number of bits in a memory word (NB), column multiplexer ratio in the memory array (CM), and number of memory banks in the memory array (BK).

Still referring to FIG. 1, a selection of one or more of the procedures 118 is made by the system IC designer 104. Only those procedures that are believed to be necessary for implementing the desired test application are selected. Examples of test applications include a background generator that can generate several different DB patterns for testing the proposed memory array, and a bitmap viewer that can identify the location of failed cells in the physical model of the proposed memory array based on memory address and data failure values (in the user interface model). The test applications may be part of a memory test and repair generator program 120 that is running in a computer workstation. Executing this program 120 including the selected procedures produces a test and repair engine design (e.g. RTL file 122).

For example, in the case of a background generator application, the application calls the selected procedures, based on the user-specified number of words that can be stored in and the column multiplexer ratio in the proposed memory array. Execution of the selected procedures yields return values which are used by the application to compute a particular type of DB pattern, i.e. a sequence of memory address and data values in the user interface model that need to be applied to the proposed memory array by the test engine. This computed DB pattern is incorporated in the test and repair engine design, by the test and repair generator 120.

The procedure generator tool 116, which produces the library of procedures 118, may be authored in any suitable computer programming language. Each of the procedures 118 produced by the tool 116, in this example, is a tool command language, Tcl, procedure. Tcl is a scripting language that is commonly used for testing. Other suitable programming languages can, alternatively, be used to define the library of procedures 118. In another alternative, some or all of the procedures may be manually created by a programmer, such as the memory IC designer 102, based on details of the already-defined memory design family. However, when multiple memory design families are contemplated, the automated procedure generator tool 116 may be advantageously reused for producing a library of procedures 118 for each of the different memory design families. This renders the process more efficient than having each new library be manually programmed. The procedure generator tool 116 may be readily authored for a suitable CAD workstation platform, by one of ordinary skill in the art, based on known details of the memory design families, and in view of the functionality required for each of the procedures 118 as described below. As an example, the library may contain the following procedures, whose respective functions are described below. The procedures implement at least two kinds of structural primitives: those that define the mapping between logical addressing and physical position (e.g. the different scrambling primitives), and those that give only physical information (e.g. strap distribution, power distribution, dummy element).

Address Scrambling

In general, variables representing the row, column and banks of a memory array may be matched to different address (logical) variables. Depending on the mapping, different row, column and bank scrambling information can be obtained. A possible format for address scrambling here is that the address variables $ADDR0, ADDR1, ADDR2 \ldots$ are mapped to the row, column and bank variables, for each possible combination of BK and CM values that define an instance of the memory array. A table format may be used to describe the functionality of this procedure (as well others given below.) The table below is for a library of a memory design family that has only two instances (two "compiler configurations"), but the procedure can be defined to encompass more.

| | | |
|---|---|---|
| BK | [value of BK for instance1] | [value of BK for instance2] |
| CM | [valued of CM for instance1] | [value of CM for instance2] |
| ADDR0 | [row number], [column number], and [bank number] corresponding to ADDR0, for instance1 | [row number], [column number], [bank number] corresponding to ADDR0, for instance2 |
| ADDR1 | | |
| ADDR2 | | |
| ... | | |
| ADDRmax | | |

The address scrambling procedure may thus implement the above table. Note that table entries may be represented by equations that define the address scrambling. Both scrambling types, namely logical-to-physical and physical-to-logical, can be obtained from this table. A Tcl procedure for address scrambling may thus return a list of pre-decoded triples (row number, column number, and bank number) that are assigned to address pins, e.g., ordered from the least significant bit to the most significant bit.

Bank Scrambling

A memory array may have a two-dimensional bank structure in general. The physical position of the banks may not correspond to the logical address. The creation of topological DB patterns may need to identify the mapping between the logical and physical bank addresses. The bank scrambling procedure would take a logical bank address as input, and would return the physical number of the corresponding bank counting from a particular preset location in the array. Similarly, another bank scramble procedure may be defined that takes a physical bank number as input, and returns the logical address of the bank.

Row Scrambling

A row scramble procedure may be defined that takes the row logical address as input from the address pins of the memory, and returns the physical row number of the corresponding row (where the reverse may also be defined as taking the physical row number as input and returning the logical row address). Note that in the event the proposed memory IC is expected to have word line twisting in the memory array, different blocks of the memory array may have different row scrambling. This results in different DB patterns being generated for different blocks of the memory array.

Column Scrambling

A column scramble procedure may be defined that takes the physical I/O number (which identifies a particular I/O device of the memory) and the logical column address as input, and returns the physical column position for the specified I/O. Similarly, a reverse procedure may also be defined that takes the physical I/O number and the physical column position as inputs, and returns the logical column address. Note that in the event the memory array has column twisting, then different blocks of the memory array may have different column scrambling. This results in different DB patterns for different blocks of the memory array. The following table is given as an example of the information that can be provided by this procedure.

TABLE 4-5

| Column Scramble Format |||||
| I/O i |||||
| CM |||||
| Column 0 | Column 1 | ... | Column (|CM|-1) |
| ... |||||

Memory Bitline Twisting and Mirroring

FIG. 2a and FIG. 2b depict an example physical structure in a memory array that creates bitline twist scrambling. Note that "T" represents a signal's "true" value while "B" represents its complement ("bar"). In this example, "L" represents "left", i.e. closer to the lower numbered, adjacent column, while "R" represents "right" (closer to the higher numbered, adjacent column). The memory bitline twist scramble procedure may be defined as returning a list of a pair of physical row numbers, a physical I/O number and a physical column number. This procedure identifies a twist row as being between certain rows and bitlines of a particular physical column. All of the bitline pairs that are twisted may be listed in a predefined order, e.g., from bottom to top and from left to right. As an example, the bitline twisting information may list the twist location as a pair of row and column addresses. Such procedure would take as input, in addition to the number of words (NW) and the column multiplexer ratio (CM), the physical column number per each I/O number, and each logical number in a CM. Thus, for a given memory compiler configuration in which NW and CM have been defined, the row addresses will need to be listed in the procedure for each I/O and each logical column number in a CM. Furthermore, a bitline twist may be indicated as being above the cell that has an identified row and column address. The following table may be used to define the information provided by this procedure.

TABLE 4-6

| Memory Bit-Line Twisting Format ||||
| Twist | I/O i |||
| Row Address | Column 0 | Column 1 | ... | Column (|CM|-1) |
| <Row$_{j1}$> |||||
| <Row$_{j2}$> |||||
| ... |||||
| $_{jk}$> |||||

I/O Bitline Twisting

The bitlines that feed the I/O cells (which includes sense amplifiers) may also twist just before connecting to an I/O cell, relative to neighboring I/O bitlines. FIGS. 3a and 3b depict I/O bitlines with no twist (a) and with a twist (b), as an example. The row addresses where there is a column twist in the same column multiplexer are listed for each I/O device. Thus, the I/O twist scramble procedure may return a list of pairs (used in memory bitline twist format) with physical I/O number and physical column number. This pair means that the bitlines of the specified column are twisted. A table format of this procedure is given below.

TABLE 4-7

| I/O Bit-line twisting format ||||
| I/O i ||||
| Column 0 | Column 1 | ... | Column (|CM|-1) |
| ... ||||

I/O Bitline Mirroring

The bitlines that connect to the I/O cells may also be mirrored relative to neighboring I/O bitlines. An example of this situation is depicted in FIG. 4. Again, this is information that may be needed for generating a topological DB pattern. In the example format here, the columns that have bitline mirroring above the I/O cells are specified for each memory compiler configuration (e.g., each combination of NW and CM), per each I/O device in each logical column number in a CM. The I/O bitline mirroring procedure thus takes a physical I/O number and physical column position as inputs, and returns a "true" value if the two bitlines of the specified physical column in the specified physical I/O take true (T) and bar (B) values, and "false" if the two bitlines take B and T values. A table format of the I/O bitline mirroring procedure is as follows.

TABLE 4-8

| I/O Bit-line mirroring format ||||
| I/O i ||||
| Column 0 | Column 1 | ... | Column (|CM|-1) |
| <TB/BT> | <TB/BT> | ... | <TB/BT> |

I/O Cell Scrambling

The I/O cells of a memory may have different ordering, in the logical and physical levels. The mapping between the logical and physical I/O cell numbers is needed for generating a DB pattern. The direction of the order of the I/O cells, e.g., left-to-right or right-to-left, may be identified and set, for the I/O scramble procedures described here. For each memory compiler configuration, e.g. each combination of NW and CM, the corresponding physical I/O number is entered into a table, per each logical I/O number. This allows the I/O scramble logical-to-physical procedure to take an I/O logical address as input, and return the physical I/O number of the corresponding I/O device. Similarly, the reverse function may also be defined as taking the physical I/O number as input, and returning the I/O logical address. The table format of the I/O cell scrambling procedure is as follows.

TABLE 4-9

| I/O cell scrambling format | | | |
|---|---|---|---|
| I/O 0 | I/O 1 | ... | I/O (# NB-1) |
| | | ... | |

I/O Column Twist

Figure 5:
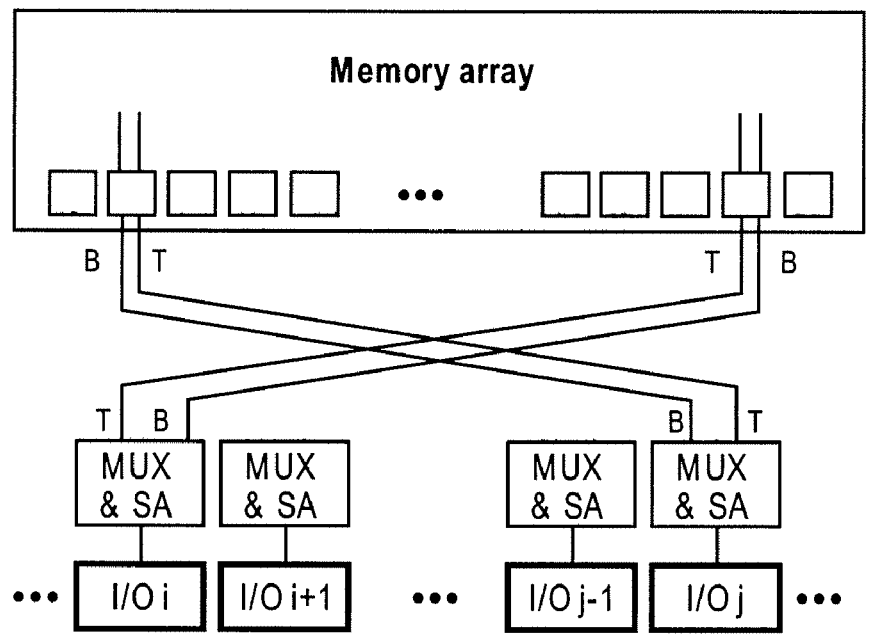
FIG. 5 shows part of a memory array that has a simple I/O column twist.

For any pair of columns of cells that are connected to I/O cells (which may include sense amplifiers and multiplexers), the columns may be deemed twisted. This is the type of information that is also useful for generating a physical DB pattern. FIG. 5 illustrates an example of I/O column twist. In an example format, columns that have a column twist above the I/O cells are specified for each memory compiler configuration, per each I/O cell in each logical column number in a CM. There may be two types of column twisting: simple and complex. A simple column twist is depicted in FIG. 5 as the switching of two column locations when a pair of one column bitline twists with the corresponding pair of second column bitlines. Note that in the simple case, the two bitlines of both columns do not twist, i.e., the topological of left-to-right order of T and B remains unchanged for each column bitline. This is not the case for a complex or complicated column twist, which can be viewed as a combination of a column twist and a bitline twist. In that case, the topological left-to-right order of T and B is changed for each pair of column bitlines. An example column twist scramble procedure may thus return a list of pairs with physical row number and a list of triples with physical I/O number, physical column number and the distance of the column that is twisted with the specified one. A table format of such a procedure is as follows.

TABLE 4-11

| Simple I/O column twist format | | | |
|---|---|---|---|
| I/O i | | | |
| Column 0 | Column 1 | ... | Column (ICMI-1) |
| | | ... | |

Column Twist

Figure 6:
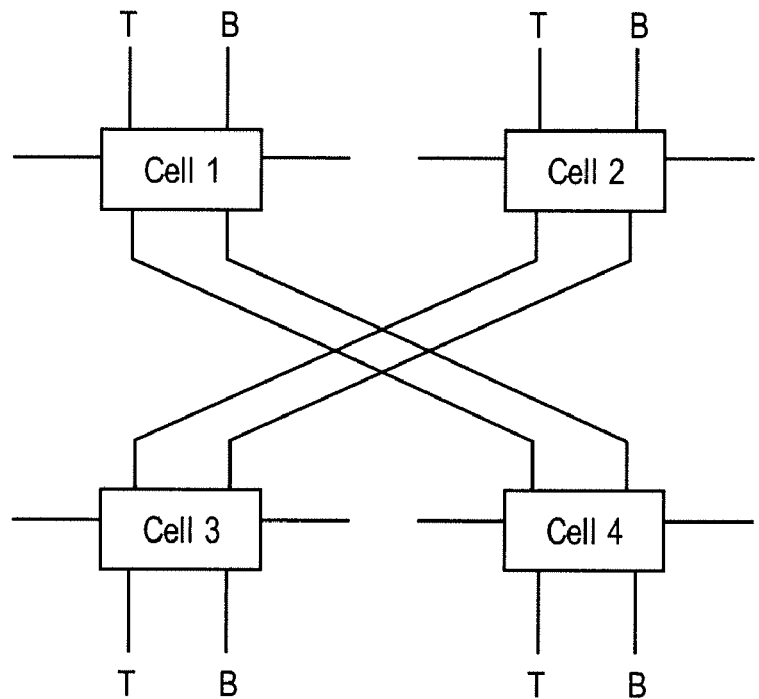
FIG. 6 shows a simple column twist between two rows of cells.

There may be at least two types of column twist: simple and complicated. Simple is depicted in FIG. 6 as the switching of two column locations when a pair of bitlines from one column twists with the corresponding pair of bitlines from another column. Note that in FIG. 6, the bitlines do not twist, i.e. the physical left to right order of T and B remains unchanged for the bylines of each column. The table format below may be used for a simple column twist scrambling procedure.

TABLE 4-13

| Simple column twist format | | | |
|---|---|---|---|
| Row address with Column | I/O i | | |
| Twist | Column 0 | Column 1 | ... Column (ICMI-1) |
| $<Row_{j1}>$ | | | |
| $<Row_{j2}>$ | | | |
| ... | | | |
| $<Row_{ik}>$ | | | |

Wordline Twist

Figure 7:
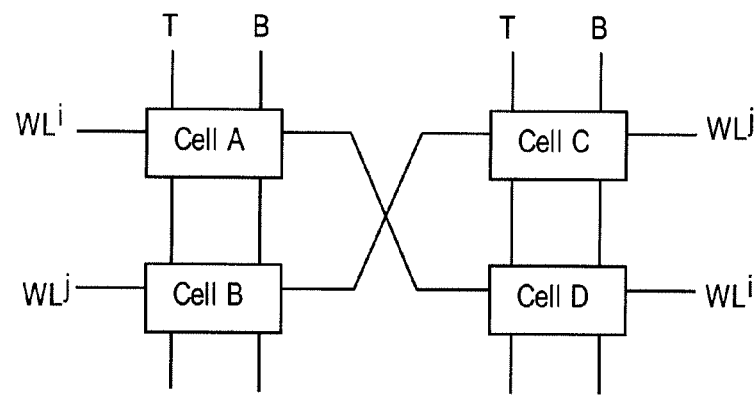
FIG. 7 shows a word line twist in a single port memory.

A wordline twist for single port memory cells may be defined as the switching of two row locations where a row wordline twists with the wordline of a second row. This is depicted in FIG. 7. The table below is for a simple wordline twist scrambling procedure that covers |CM| columns and k rows. The procedure returns a list of numbers that identify a pair of I/O cells, a pair of columns and a pair of rows (in the middle of which each wordline twist occurs).

TABLE 4-14

| Simple word-line twist format | | | |
|---|---|---|---|
| Twist Word-Line | I/O i | | |
| Address | Column 0 | Column 1 | ... Column (ICMI-1) |
| $<Word-Line_{j1}>$ | | | |
| $<Word-Line_{j2}>$ | | | |
| ... | | | |
| $<Word-Line_{ik}>$ | | | |

Port Scrambling

For dual port memories, the physical and logical labeling of ports needs to be described. In practice, the memory logical port labeling, as well as bitline labeling, may not match the physical labeling. The following table will be filled out in such a scrambling procedure, useful for multi-port memories. Port numbers P1, P2, ... will be entered for each logical I/O number I, i=0, 1, ..., NB−1, for each column in the CM, and each bitline in a column. Formulas may be used as shorthand to define the range of parameter value variation.

TABLE 4-16

| Port scramble format | | | |
|---|---|---|---|
| I/O i | | | |
| CM | | | |
| Column c0 | Column c1 | ... | Column $C_{(|CM|-1)}$ |
| $bl_1$ $bl_2$ ... $bl_{2k}$ | $bl_1$ $bl_2$ ... $bl_{2k}$ | | $bl_1$ $bl_2$ ... $bl_{2k}$ |
| ... ... ... ... | ... ... ... ... | | ... ... ... ... |

Metal Layer Scrambling

In some memory types, such as HD Dual Port ASAP 512K memory, the port bitlines are located on different metal layers. A logical numbering of metal layers Mi1, Mi2, ... may not match the physical numbering M1, M2, ... (e.g., due to a change in the metal layer of a port bitline at the center of the array.) Accordingly, a scrambling procedure may be defined that, for each memory compiler configuration (NW,CM), takes a metal layer parameter as input and returns the corresponding physical layer.

Physical Straps

Figure 8:
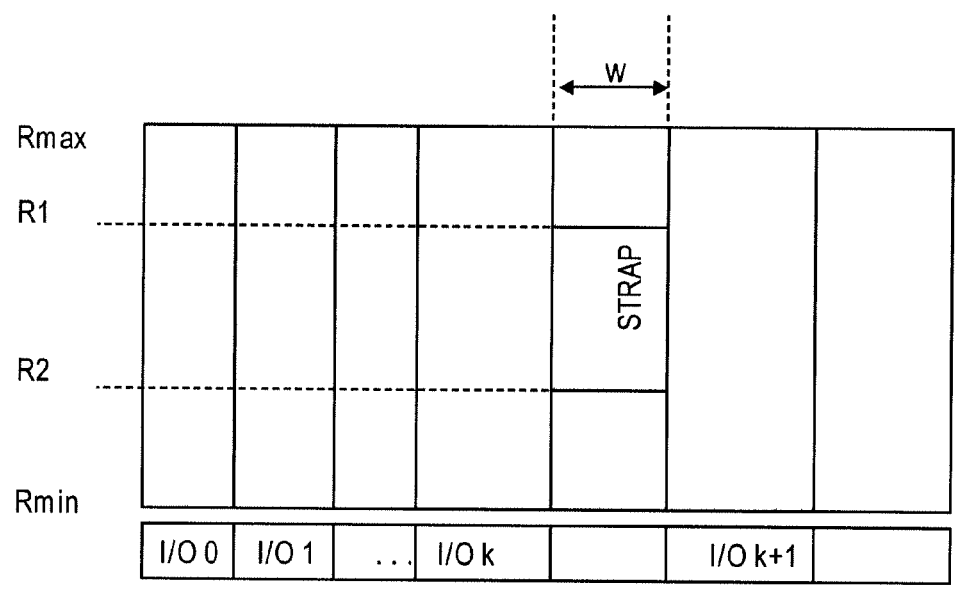
FIG. 8 shows an example of a rectangular physical strap in a memory array.

Statistics show that the awareness of straps used to locate decoders in a memory array can reduce the probability of certain types of defects between certain bitlines and/or wordlines. Both the location of physical strap and its size (here, width) is useful for simplifying a DB pattern. FIG. 8 shows an example strap in a memory array, where w indicates strap width. The table format below locates a rectangular strap through two row address and/or two column addresses. Each column address is defined by a pair of numbers: I/O number and the column number in a corresponding CM.

TABLE 4-20

Physical strap format

<Strap Name>

Width/length
Row1
Row2
I/O, Column 1
I/O, Column 2

Power Line Distribution Among Bitlines

Figure 9:
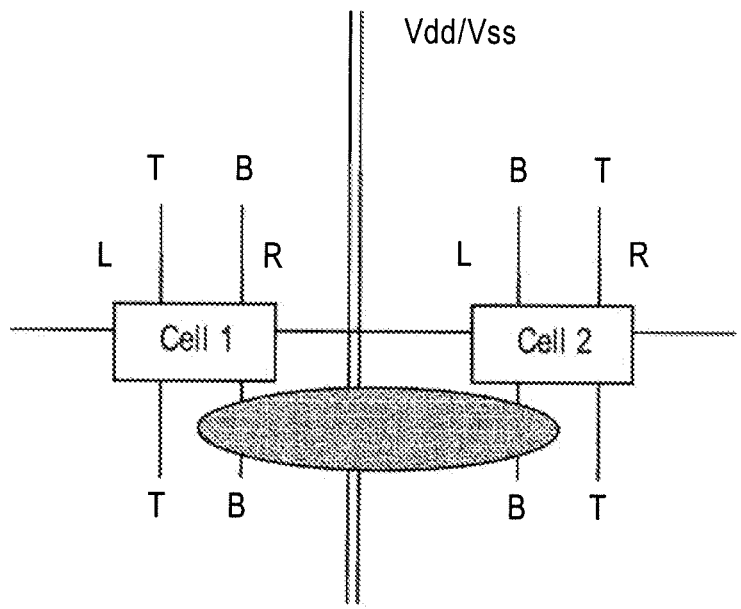
FIG. 9 shows an example of a power line between neighboring bitlines of adjacent cells.

In some cases, if a Vdd power line is located between two neighboring bitlines of two adjacent cells in the same row, e.g. see FIG. 9, and it is in the same metal layer as cell bitlines, then a spot defect connecting these two neighboring bitlines will be shorted to the Vdd line. As a result, a struch at 1 fault will be detected by running a test algorithm. Since most nontrivial March tests detect stuck at faults, there is no need to provide a checkerboard DB pattern between two of such cells. This realization can simplify the process of generating the DB pattern into smaller sub-arrays, and may also decrease the overall number of DB patters applied in the testing. In the following table format for this procedure, the labels BT, BB, Vdd, Vss will need to be entered for each logical I/O number I, i=0, 1, . . . NB−1, each column in the CM, each metal layer, and each physical line in the same layer column.

TABLE 4-23

Distribution of $V_{DD}$ and $V_{ss}$ lines between same layer bit-lines
I/O i
CM

| | Column c0 | | | ... | Column $c_{(|CM|-1)}$ | | | |
|---|---|---|---|---|---|---|---|---|
| | line 1 | line 2 | ... | line k | line 1 | line 2 | ... | line k |
| Row0 | ... | ... | ... | ... | ... | ... | ... | ... |
| ... | ... | ... | ... | ... | ... | ... | ... | ... |
| ROW$_{max}$ | ... | ... | ... | ... | ... | ... | ... | ... |

The procedure returns a list that contains the power line sequences with the metal layer name as its first element, then it contains power line distribution options. The power line sequence is the minimum pattern that is multiplied along X direction, for example {m2{BA TA BB TB VDD TB BB TA BA}}. The possible distribution options are 'x_miror', 'port_swap' and 'ml_change'. x_mirror means that XDEC mirroring is present and the described sequence is for the right half of the memory instance. port_swap makes sense for dual port memories only and if 'x_mirror' is active, it means that port bitlines are swapped for left and right halves of the memory instance. ml_change makes sense for dual port memories only and if the bit-lines of A and B port are on different metal layers, it means that the bit-lines of both ports change their metal layer in the center of memory array. Other ways of defining the output of such a procedure are possible.

Power Line Distribution Among Wordlines

The following table format of such a procedure will have to be filled out for each memory compiler configuration (NW, CM). Corresponding line labels (Wordline1, wordline 2, Vdd, Vss) will need to be entered for each logical I/O number I, each row, each metal layer, and each physical line in a same layer row.

TABLE 4-25

Distribution of $V_{DD}$ and $V_{ss}$ lines between word-lines in the same layer
I/O i

| | Row0 | | | | Row max | | | |
|---|---|---|---|---|---|---|---|---|
| | line $_1$ | line$_2$ | ... | line$_k$ | line $_1$ | line$_2$ | ... | line$_k$ |
| Colum n | ... | ... | ... | ... | ... | ... | ... | ... |
| ... | ... | ... | ... | ... | ... | ... | ... | ... |
| Colum nc$_{(|CM|-1)}$ | ... | ... | ... | ... | ... | ... | ... | ... |

The power_line_distribution_wl procedure returns a list that contains the power line sequences with the metal layer name as its first element, then it contains power line distribution options. The power line sequence is the minimum pattern that is multiplied along Y direction, for example {m3{VSS WL A VDD}}. A distribution option may be defined, similar to the bitline procedure above.

Redundancy Distribution

Figure 10:
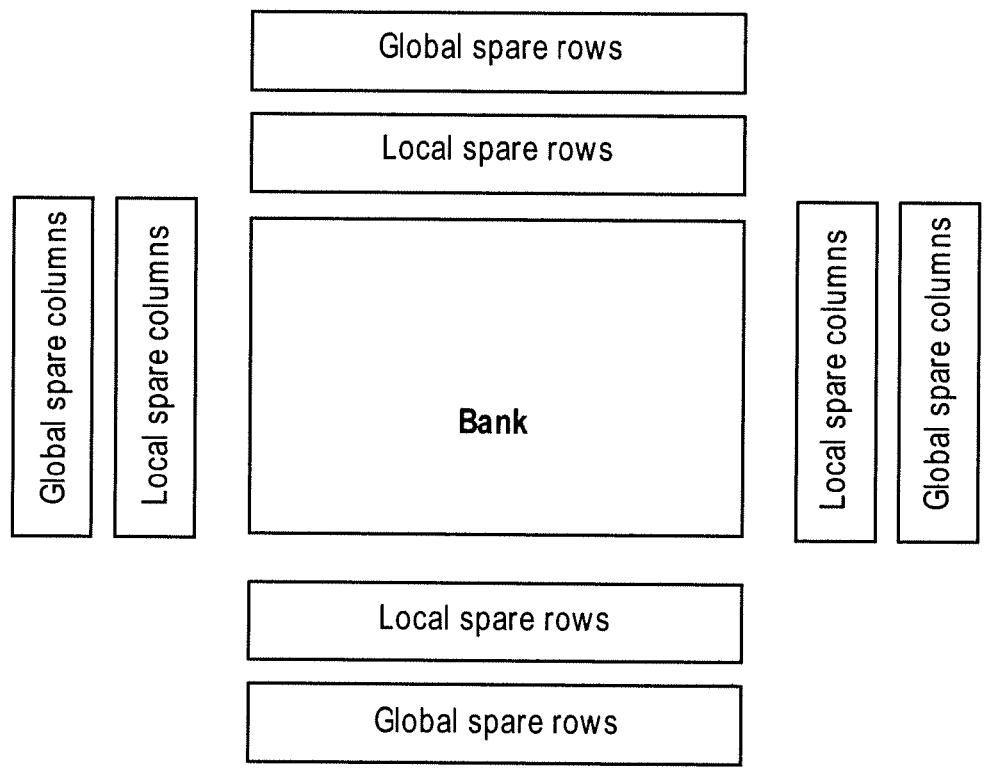
FIG. 10 illustrates an example of redundancy distribution for a memory bank.

After testing, a repair application can be applied to a memory structure. This is the application in which information on the distribution of the redundancies and their scrambling, may be used. FIG. 10 shows a typical redundancy distribution for a memory bank. The following table format of this procedure is given.

TABLE 4-27

Redundancy distribution

Redundancy type (row/column)

BK
Bank-half (left / right / not available)
Location of redundancies w.r.t. bank
(top / boftom / left / right)

| Global redundancy | Local redundancy |
|---|---|

As an example, this procedure returns a list of memory column blocks. Each block is a list of the identical column groups. Each group is a group itself or is a group type and number of columns in that group. Defined group types may include:
  m—main columns (rows)
  lr—local redundant columns (rows)
  gr—global redundant columns (rows)
  d—dummy columns (rows)
  For example the returned value may be
  "{{lr 2 m 128} {m 128 lr 2}}"

This example describes a memory array having two banks of 128 main columns each, side by side, with one group of two private columns to the left of one bank, and another group of two private columns to the right of the other bank. A similar table format may be included for describing the distribution of row redundancies.

Repair Scrambling

The test engine may be an actual built-in self test (BIST) engine (built into the memory IC chip, or a separate chip). The repair (including for example the blowing of fuses) may be performed by the test engine, after manufacturing of the IC chip, not during the design of the test engine. So the actual repair information, including which columns or rows are to be replaced, may not be generated until after the test engine has been built and allowed to complete the test. The memory in the chip is then reconfigured when the repair process is allowed to be completed.

Repair Scrambling describes the repair mechanism for all redundant elements in the proposed memory array. This information is used by different applications to predict the reconfiguration of memory after repair. It is possible to inject faults into memory behavioral model, run the BIST and built-in redundancy analysis (BIRA). Repair scrambling identifies exactly how a faulty cell is replaced by a redundant element. For example it may be shift based repair (widely used for column repair) or re-addressing based repair (mainly used in row repair).

Example Test Applications

The following are example test applications that can be readily authored based on the selection of procedures given for each. The testing capability of these applications may be incorporated into the test and repair engine design.

1. Coordinate Calculator

A coordinate calculator that can calculate physical coordinates of faulty memory cells within chip, may be authored using the following selection of procedures from the library: Address Scramble; Bank Scramble; Row Scramble; I/O cell scramble; column scramble; I/O column twisting; column twisting; word-line twisting; strap distribution; and power-line distribution.

2. Bitmap Viewer

A bitmap viewer that can visualize faulty memory cells, highlight their neighboring cells and find their logical addresses, may be authored using the following selection of procedures from the library: Address Scramble; Bank Scramble; Row Scramble; Column scrambling; I/O Cell scrambling; I/O Column twisting and Column twisting.

3. Background Pattern Generator

A DB pattern generator may be authored that generates RTL pattern generator of an input address (in the user interface model) and background pattern type (Checkerboard, Solid, Row Stripe, etc.) calls the following selection of procedures from the library: Address Scramble; Bank Scramble; Row Scramble; Column scrambling; I/O Cell scrambling; I/O Column twisting; Column twisting; I/O bit-line mirroring; I/O bit-line twisting; Bit-line twisting; word line twisting; Power line distribution and Strap distribution.

4. Physical Address Generator

An application can be readily authored that produces the complete physical location (in the physical model) of an input address (in the user interface model), by calling the following selection of procedures from the library: Address Scramble; Bank Scramble; Row Scramble; Column scrambling; I/O Cell scrambling; I/O Column twisting and Column twisting.

Figure 11:
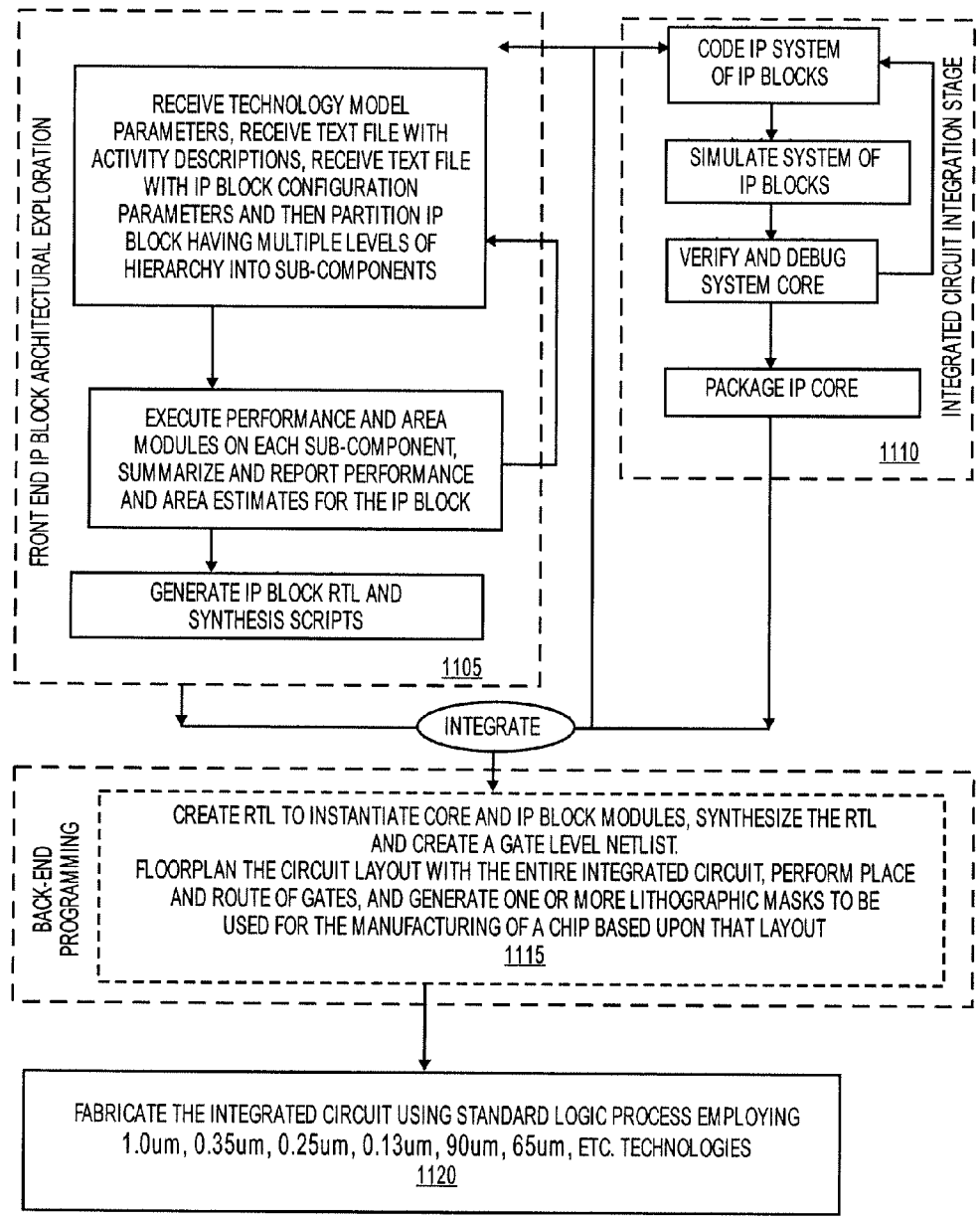
FIG. 11 illustrates a flow diagram of an example process for generating an IC device having a built-in test engine.

FIG. 11 illustrates a flow diagram of an example process for generating a device, such as a System on a Chip, with a built-in test engine created as described above. The example process may utilize an electronic circuit design generator, such as a memory compiler, that is part of an Electronic Design Automation (EDA) toolset. The information representing the apparatuses and/or methods described above may be contained in an instance of a cell library, soft instructions in an electronic circuit design generator such as a compiler, or similar machine-readable storage medium storing this information. The information representing the apparatuses and/or methods stored on the machine-readable storage medium may be used in the process of creating the apparatuses and/or methods described above.

Aspects of the above design may be part of a software library containing, for example, a set of standard circuit cells.

The cell libraries provide a broad set of basic logic, storage and I/O functions and are designed to accommodate more advanced capabilities. The library cells are developed in accordance with industry standards and may support a wide range of frequencies. The libraries may be suited for 0.13 µm, 90 nm, and even smaller gate length designs.

The electronic circuit design generator may be used for making a highly configurable, scalable System On a Chip (SOC). In an embodiment, an example electronic circuit design generator may comprise the following: a graphic user interface; a common set of processing elements; and a library of files containing design elements such as circuits, control logic, and cell arrays. Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. Back-end programming further includes the physical verification of the layout to verify that it is physically manufacturable and the resulting SOC will not have any function-preventing physical defects. While front-end views support documentation, simulation, debugging, and testing, the back-end files, such as a layout, physical Library Exchange Format (LEF), etc are for layout and fabrication.

The electronic circuit design generator may include object code in a set of executable software programs. The library of files containing design elements may be a stand alone program by itself. The electronic circuit generator provides timing diagrams, power and area aspects of each component, models coded to represent the components in order to run actual operation and configuration simulations. The electronic circuit design generator may generate a netlist and a layout targeted to fit in the space available on a target chip. Typically, the electronic circuit design generator will store the data representing the memory test engine on a machine-readable storage medium. The electronic circuit design generator then may provide the device layout (including that of the test engine) to be used to generate one or more lithographic masks utilized in the fabrication of the device including the test engine. The electronic circuit design generator may also provide a netlist for verification of the device and the test engine.

In block 1010, the electronic circuit design generator may provide designs to simulate and verify the operation of the circuits. The machine may also generate simulations of representations of the circuits described above that can be functionally tested, timing tested, debugged and validated.

In block 1015, the generated device layout may be integrated with the rest of the layout for the chip. Also, the machine may generate representations of the circuits described above for simulations, one or more lithographic masks for transferring the circuit design onto the chip during manufacture, or other similar useful derivations of the circuits described above.

In block 1020, a fabrication facility may fabricate one or more chips utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. In one embodiment, the electronic circuit design generator is designed for embedded applications in a standard CMOS logic process.

In one embodiment, an electronic circuit design generator may be implemented in software as a set of data and instructions, such as a software cell library callable to other programs, or as an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. A computer-implemented method for creating an integrated circuit, IC, test engine for testing a proposed IC memory array, comprising:
   accessing (1) information that defines a proposed IC memory array including the number of words that can be stored, number of bits in word and a column multiplexer ratio in the proposed IC memory array, and (2) a selection of one or more procedures from a procedure library that includes a plurality of computer-readable procedures, the plurality of procedures as a whole translate between a physical model of a family of IC memory arrays and a user interface model of the family,
   wherein each of the plurality of procedures is to produce one or more structural primitives that either describe a mapping between addressing in the user interface model and physical model position, or give only physical model information, without analyzing a CAD layout file of the proposed IC memory array.

2. The method of claim 1 further comprising:
   producing a data background, DB, pattern to be used by the test engine in testing the proposed IC memory array, wherein the DB pattern is produced by executing the one or more procedures of said selection, wherein the one or more procedures of said selection take as input the accessed number of words and column multiplexer ratio.

3. The method of claim 1 wherein the plurality of procedures include at least a first procedure that returns physical model locations of straps and strap width in the proposed IC memory array, and a second procedure that identifies physical model columns which have a column twist above I/O cells of the proposed IC memory array.

4. The method of claim 1 wherein the number of words that can be stored, the column multiplexer ratio and the selection of one or more procedures are received from an IC designer.

5. The method of claim 1 wherein the procedures include a further procedure that returns a list of assigned, address pin names in the user interface model.

6. The method of claim 1 wherein the procedures include a further procedure that takes a bank address in the user interface model as input, and in response identifies a corresponding physical bank in the physical model.

7. The method of claim 4 wherein the procedures include a further procedure that takes a physical bank number in the physical model as input, and in response returns a corresponding address in the user interface model.

8. The method of claim 6 further comprising:
   receiving from the IC designer input for a background generator program including the type of DB pattern to produce, wherein the background generator program calls a subset of the plurality of procedures to determine the address and data sequences needed in the user interface model to produce the DB pattern.

9. The method of claim 5 further comprising:
   executing a bitmap viewer program that identifies the location of a failed cell in the physical model, based on address and data failure values in the user interface model, wherein the bitmap viewer program calls a subset of the plurality of procedures to compute the location.

10. An article of manufacture comprising:
    a machine-readable medium having stored therein instructions that, when executed by a processor, read the number of words that can be stored, number of bits in word and a column multiplexer ratio in a proposed IC memory array, and a selection of a plurality of procedures from a procedure library that includes a plurality of computer-readable procedures, wherein each of the selected procedures is to produce one or more structural primitives that describe certain physical layout features of the proposed IC memory array, without analyzing a CAD layout file of the proposed IC memory array, the library as a whole translates between a physical model of a family of IC memories and a user interface model of the family, and
    generate a bitmap view of the proposed IC memory array by computing the location of a failed cell in the physical model of the desired IC memory array, based on address and data failure values in the user interface model, by calling the selected procedures to translate between the user interface model and the physical model in order to compute the location.

11. The article of manufacture of claim 10 wherein selected procedures comprise:
   an address scramble procedure;
   a bank scramble procedure;
   a row scramble procedure;
   an I/O cell scramble procedure;
   a column scramble procedure;
   an I/O column twisting procedure; and
   a column twist procedure.

12. The article of manufacture of claim 10 wherein the selected procedures comprise a row scramble procedure that takes a row logical address as input and returns a corresponding physical row number in the physical model.

13. The article of manufacture of claim 10 wherein the selected procedures comprise a bank scramble procedure.

14. The article of manufacture of claim 10 wherein the selected procedures comprise an address scramble procedure.

15. The article of manufacture of claim 10 wherein the selected procedures comprise redundancy distribution procedure.

16. The article of manufacture of claim 15 wherein the selected procedures comprise a repair scrambling procedure.

17. A computer system for designing an integrated circuit (IC) system, comprising:
   a memory test and repair generator that is to access a procedure library containing a plurality of computer-readable procedures, wherein each of the procedures is to produce one or more structural primitives that describe certain physical layout features of a proposed IC memory array, without analyzing a CAD layout file of the proposed IC memory array, the plurality of procedures as a whole translates between a physical model of a family of IC memories and a user interface model of the family,
   the test and repair generator is to access the number of words that can be stored and a column multiplexer ratio in the proposed IC memory array, access a selection of a plurality of procedures from the library, and produce a memory test engine design that is to apply a data background, DB, pattern for testing the proposed IC memory array, the test and repair generator to produce the DB pattern by executing the selected procedures, wherein the selected procedures take as input the received number of words and column multiplexer ratio.

18. The system of claim 17 wherein the selected procedures comprise:
   an address scramble procedure;
   a bank scramble procedure;
   a row scramble procedure;
   an I/O cell scramble procedure;
   a column scramble procedure
   an I/O column twisting procedure
   a column twist procedure;
   a strap distribution procedure; and
   a power line distribution procedure.

19. The system of claim 17 wherein the selected procedures comprise:
   a first procedure that returns physical model locations of straps and strap width in the proposed IC memory array; and
   a second procedure that identifies physical model columns which have a column twist above I/O cells of the proposed IC memory array.

* * * * *